US007538474B2

(12) United States Patent
Wong

(10) Patent No.: US 7,538,474 B2
(45) Date of Patent: May 26, 2009

(54) SYSTEM AND METHOD FOR MICRO ELECTRO MECHANICAL SYSTEM (MEMS) DEVICE CHARACTERIZATION

(75) Inventor: Wai Kin Wong, Singapore (SG)

(73) Assignee: National University of Singapore, Singapore (SG)

( * ) Notice: Subject to any disclaimer, the term of this patent is extended or adjusted under 35 U.S.C. 154(b) by 591 days.

(21) Appl. No.: 11/393,419

(22) Filed: Mar. 30, 2006

(65) Prior Publication Data

US 2006/0243023 A1 Nov. 2, 2006

Related U.S. Application Data

(60) Provisional application No. 60/666,321, filed on Mar. 30, 2005.

(51) Int. Cl.
*H01L 41/113* (2006.01)
*G01H 1/00* (2006.01)
*G01D 7/00* (2006.01)

(52) U.S. Cl. .......................................... 310/319; 73/587

(58) Field of Classification Search ................. 310/319, 310/338; 73/1.82, 587
See application file for complete search history.

(56) References Cited

U.S. PATENT DOCUMENTS 4,084,189 A * 4/1978 Lean .......................... 348/198
4,267,732 A * 5/1981 Quate .......................... 73/606
6,421,165 B2 * 7/2002 Hewlett ...................... 359/291
2003/0160967 A1 * 8/2003 Houston et al. ............. 356/501
2008/0264144 A1 * 10/2008 Mao et al. .................... 73/1.82

OTHER PUBLICATIONS

D.A. Czaplewski et al., "Mechanical dissipation in tetrahedral amorphous carbon," Journal of Applied Physics 97, 023517 (2005).
Hans Haucke et al., "Effects of annealing and temperature on acoustic dissipation in a micromechanical silicon oscillator," Applied Physics Letters 86,181903 (2005).
B.H. Houston et al., "Thermoelastic loss in microscale oscillators," Applied Physical Letters 80(7):1300-1302 (Feb. 18, 2002).
Ron Lifshitz, "Phonon-mediated dissipation in micro- and nano-mechanical systems," Physica B 316-317:397-399 (2002).
Jinling Yang et al., "Energy Dissipation in Submicrometer Thick Single-Crystal Silicon Cantilevers," Journal of Microelectromechanical Systems 11(6):775-783 (Dec. 2002).
Kevin Y. Yasumura et al., "Quality Factors in Micron- and Submicron- Thick Cantilevers," Journal of Microelectromechanical Systems 9(1):117-125 (Mar. 2000).

* cited by examiner

*Primary Examiner*—Thomas M Dougherty
(74) *Attorney, Agent, or Firm*—Ostrolenk, Faber, Gerb & Soffen, LLP

(57) ABSTRACT

A system and method for Micro Electro Mechanical System (MEMS) device characterization. The system comprising a stimulator for stimulating the device to generate phonons in the device; a detector for detecting the generated phonons; a converter for converting the phonons into a signal representative of displacement of a MEMS component of the device.

17 Claims, 7 Drawing Sheets

SYSTEM AND METHOD FOR MICRO ELECTRO MECHANICAL SYSTEM (MEMS) DEVICE CHARACTERIZATION

REFERNCE TO RELATED APPLICATION

This application claims the benefits of the filing date of U.S. Provisional Patent Application 60/666,321 filed Mar. 30, 2005, the disclosure of which is herein incorporated by reference.

FIELD OF INVENTION

The present invention relates broadly to a system and method for Micro Electro Mechanical System (MEMS) device characterization.

BACKGROUND

Presently, there are little or no developments on tools and methodologies custom-developed specifically for the characterization of Micro Electro Mechanical System (MEMS) devices for performance and quality assessment, reliability and failure analysis feasible for mass-volume manufacturing applications. One specific area is a need for a fast, cost-effective and reliable way for the in-situ, dynamic characterization of MEMS devices such as microswitches, accelerometers and gyroscopes.

The most-widely used technique for dynamic displacement measurements of MEMS devices at present is Doppler Laser Vibrometry (LDV). While accurate, this technique is essentially designed for offline application and is not suitable for inline applications owing to its intrinsically low throughput.

Further, the LDV method requires an optical beam to be precisely positioned over each structure to be characterized. This results in a severe limitation on the throughput of the LDV method. A high throughput requirement is particularly critical for die and package-level testing of dynamic MEMS products for which phonon-based characterization is ideally suited.

The LDV method also requires an encapsulated sample to be decapsulated in order for the LDV photon beam to gain direct access to the MEMS structure. This decapsulating step very often renders the MEMS device inoperable due to the loss of hermeticity and fundamental functional disruption, e.g. loss of the magnetic field in electromagnetically-latched MEMS microswitches.

Therefore, there is a need to provide an alternative MEMS characterization technique to address at least one of the above-mentioned problems.

SUMMARY

In accordance with a first aspect of the present invention, there is provided a system for Micro Electro Mechanical System (MEMS) device characterization; the system comprising: a stimulator for stimulating the device to generate phonons in the device; a detector for detecting the generated phonons; a converter for converting the phonons into a signal representative of displacement of a MEMS component of the device.

The signal may comprise an electrical signal.

The detector and the converter may be implemented as a piezoelectric transducer for detecting and converting the phonons into the electrical signal.

The system may further comprise an acoustic coupler disposed between the device and the piezoelectric transducer.

The system may further comprise an amplifier for amplifying the electrical signal.

The stimulator may comprise a driving signal source for activating the MEMS component.

The stimulator may apply an external force to the MEMS device for activating the MEMS component.

In accordance with a second aspect of the present invention, there is provided a method for Micro Electro Mechanical System (MEMS) device characterization; the method comprising the steps of: stimulating the device to generate phonons in the device; detecting the generated phonons; converting the phonons into a signal representative of displacement of a MEMS component of the device.

The signal may comprise an electrical signal.

The phonons may be detected and converted into the electrical signal utilising a piezoelectric transducer.

The method may further comprise utilising an acoustic coupler disposed between the device and the piezoelectric transducer.

The method may further comprise utilising pliable materials with the acoustic coupler for non-planar samples.

The method may further comprise amplifying the electrical signal.

The stimulating may comprise activating the MEMS component utilising a driving signal for the MEMS device.

The stimulating may comprise activating the MEMS component by applying an external force to the MEMS device.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Phonons are generated whenever physical motion is involved in a Device-Under-Test (DUT) due to the formation of stress-strain zones. Physical motion in the context of microswitches is obtained by actuating the device using an external electrical signal generator, while other devices such as accelerometers and gyroscopes require external mechanical stimuli. The stress-strain can be alleviated as a natural physical response of the material by dissipating energy in the form of phonons or acoustic waves. The phonons generated carry information pertaining to mechanical motion-related parameters such as amplitude, frequency, damping factor of the devices, resonance modes, and physical and material properties such as dimensions of immediate phonon interaction space, density, acoustic impedance, stiffness and elasticity.

Figure 1:
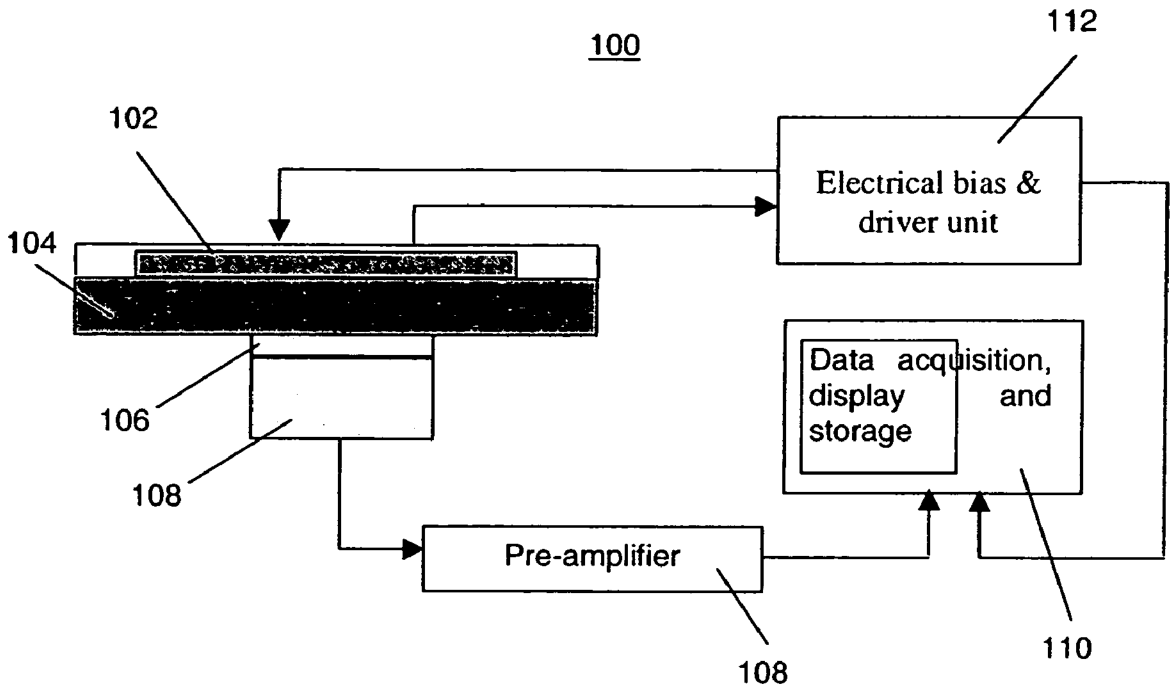
FIG. 1 shows a schematic diagram of a phonon-based characterization system.

FIG. 1 shows a schematic diagram of a phonon-based characterization system 100. The microstructure 102 to be analysed sits on a sample substrate 104. The sample substrate 104 is typically a die housed in a package. The microstructure 102 can be encapsulated. The system 100 utilises detection of phonons generated during dynamic MEMS operation to remotely characterize device operation. Thus, direct access to the actual dynamic MEMS structure and hence destructive sample decapsulating is unnecessary.

A phonon detector and converter in the form of a piezoelectric transducer 106 is placed in contact with the sample substrate 104 to facilitate acoustic coupling between the sample substrate 104 and the piezoelectric transducer 106. The piezoelectric transducer 106 is made of materials including but not limited to titanate compounds such Lead Zirconate Titanate (PZT), Barium Titanate ($BaTiO_3$) and PolyVinyl Dene Fluoride (PVDF). Other devices may be used as an acoustic to electrical converter in the system 100.

For planar samples such as MEMS dies, the piezoelectric transducer 106 is mounted on the backside of the samples e.g. 104. The piezoelectric transducer 106 converts phonon energy into an electrical signal. An electrically-conducting metal spacer 108 is used as an electrical feed through for the transducer 106. The metal spacer 108 also improves the efficiency of the piezoelectric transducer 106 by confining the phonon energy within the piezoelectric transducer 106 using acoustic reflection.

The output signals of the piezoelectric transducer 106 have typical amplitude in the order of microvolts. Hence, preferably adequate screening and proper grounding of the system are provided for improving signal quality. Further improvement can be obtained by the use of appropriate pre-amplification to reduce the relative effects of noise before subsequent signal display and processing. In the system 100, the output signals of the piezoelectric transducer 106 are amplified by a preamplifier 108.

The output signals are subsequently processed for signal acquisition, display and storage. A computer 110 is used for digital acquisition, processing and storage. Examples of display and processing include but not limited to time and frequency domain processing of the signal using oscilloscopes and spectrum analysers and, lock-in and box-car averaging for low signal situations.

A stimulator in the form of an electrical bias and driver unit 112 coupled to driver and bias contacts (not shown) respectively of the microstructure 102 for device actuation is employed in the system 100 for microstructures such as MEMS microswitches.

For passive MEMS structures, the arrangement is modified for external stimulus being provided by applying a known acceleration into the device. In such an arrangement, the stimulation involves transferring a mechanical displacement or acceleration from an electrodynamic shaker through multiple electromechanical interfaces into the MEMS devices under test, such as MEMS accelerometers.

Figure 2:
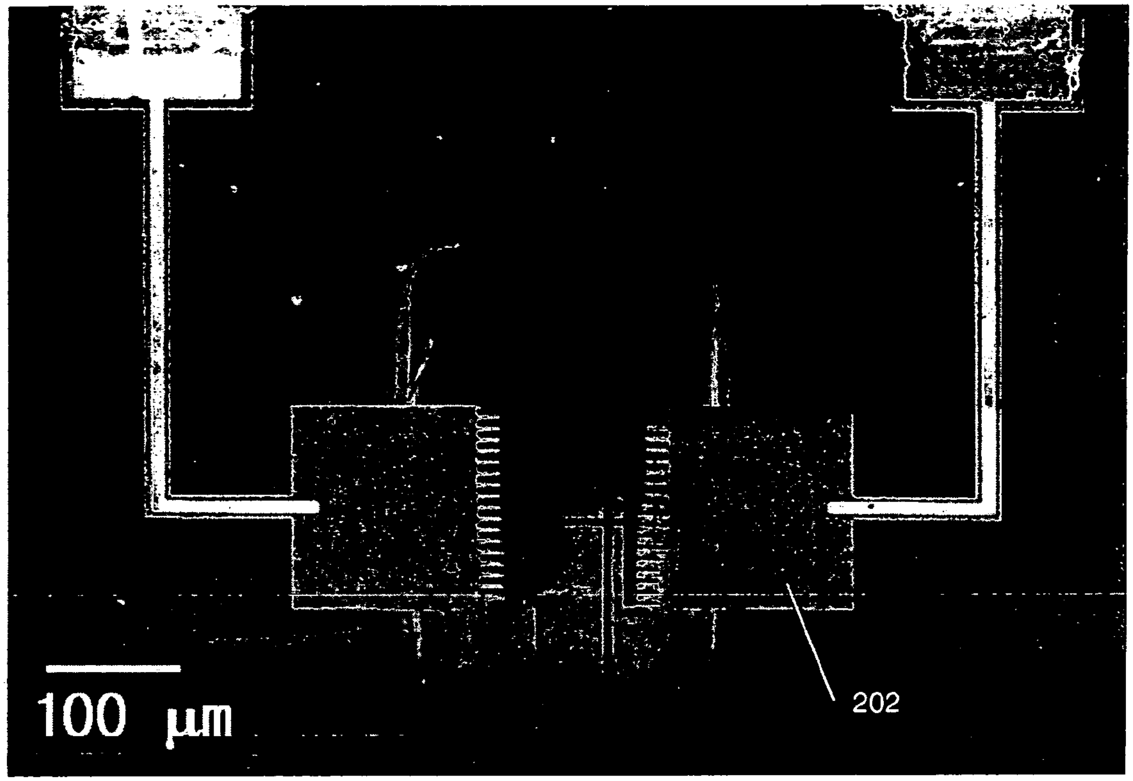
FIG. 2 shows a direct current (d.c.) biased electrostatically driven comb resonator.

FIG. 2 shows a direct current (d.c.) biased electrostatically driven comb resonator 202. The displacement of the oscillating comb resonator 202 at resonance assuming linear electrostatic force-displacement behavior can be expressed as $$x(t) = Q\cdot\frac{\text{Force}}{k_{sys}} = \frac{Q(\partial C/\partial x)}{2k_{sys}}[2V_p v_d \sin(wt) + V_p^2 + v_d^2\sin^2(wt)] \qquad (1)$$

where Q is the resonator quality factor, ∂C/∂x is the derivative of the drive capacitance with respect to displacement and is a constant as long as the amplitude of motion does not exceed the comb finger overlap, $k_{sys}$ is the spring constant of the movable mechanical structure, $V_p$ is the applied d.c. bias voltage, $v_d$ is the amplitude of the alternating (a.c.) drive voltage, and ω is the angular frequency of $v_d$.

The periodic mechanical displacement of the resonator 202 sets up phonon waves that propagate throughout the bulk solid of the device. Detection of these phonons can be accomplished using piezoelectric conversion. The voltage output of a cylindrical piezoelectric transducer assuming one-dimensional, lossless propagation and ignoring reflection effects can be expressed as $$V(t) = \frac{hg_{33}}{\pi r^2}Kx(t) \qquad (2)$$

where h is the thickness of the piezoelectric disc, $g_{33}$ is the piezoelectric voltage constant along the axis of the phonon propagation, r is the radius of the piezoelectric disc, and K is the spring constant dependent on Young's moduli E of the propagation medium and piezoelectric transducer.

Equation (2) suggests that for a given detector configuration, the output voltage of the piezoelectric transducer V(t) is directly proportional to the displacement of the resonator drive element x(t) albeit with a phase shift due to the phonon propagation delay through the device bulk, assuming linear behavior of the resonator 202 and flat amplitude response of the piezoelectric transducer. The electrical response of the lead zirconate titanate (PZT) transducer used (Morgan Electro Ceramic's PZT-5B) is characterized with an intrinsic resonant peak at about 129.2 kHz with a −3 dB bandwidth of 3.6 kHz. Otherwise, the frequency response of the phonon detector is flat with a measured −3 dB low-pass cutoff at 300 kHz.

In experiments for phonon-mediated dynamic MEMS characterization, electrostatic comb drive resonators 202 are studied in-vacuo on a Hitachi S-3500N SEM as shown in FIG. 2. In the SEM's high vacuum environment (around $6.0\times10^{n6}$ Torr), higher resonator amplitudes and Q-factors compared to atmospheric pressure are expected due to the absence of viscous damping, assuming that the dominant energy loss mechanism is external air damping given the design and cantilever dimensions of the resonator 202.

High resolution secondary electron imaging (about 5 nm at primary beam energy of 25 keV) is employed to measure the physical displacement of the resonators 202. The resonators 202 are driven using an HP 33120A frequency generator and the tune-domain phonon voltage waveforms acquired using an HP Infinium 54825A digital storage oscilloscope. The minimum frequency stepping is 0.01 Hz. The worst-case uncertainty of the phonon voltage measurements due to noise is estimated at about 250 μV peak to peak with 512× sample averaging, which is equivalent to a resonator displacement error of 14.3 nm at an average displacement-to-phonon detection gain of 17.5 mV/μm.

The detection gain was found to be a strong function of sample and mounting, and can vary significantly depending on the acoustic coupling efficiency between the device and the PZT. Detection gain values between 11.8 to 25.2 mV/μm are recorded, corresponding to phonon spring constant K in Equation (2) from $6.05\times10^{4}$ to $1.293\times10^{5}$ N/m for $h=1.6\times10^{-3}$ m, $r=8.0\times10^{-3}$ m and $g_{33}=24.5\times10^{-3}$ Vm/N.

Figure 3:
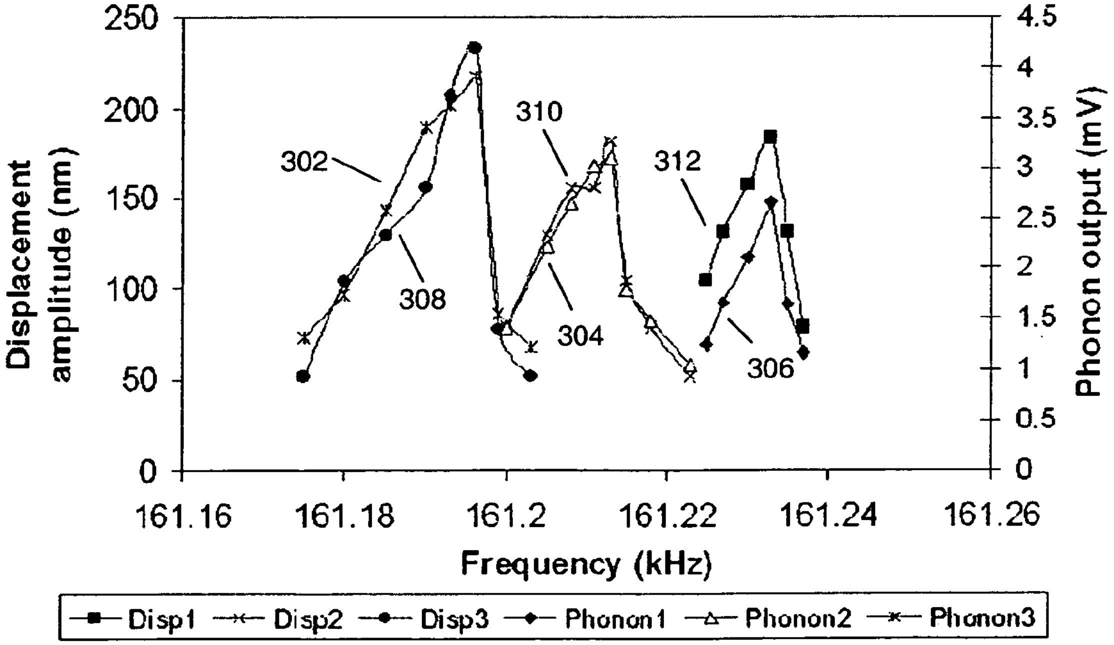
FIG. 3 shows three graphs of phonon output obtained from the resonator of FIG. 2 in vacuum using phonon sensing plotted as a function of frequency and three graphs of displacement amplitude obtained using SEM technique plotted as a function of frequency.

The resonator 202 (FIG. 2) is tested under vacuum using phonon sensing under low-drive conditions. FIG. 3 shows three graphs 302, 304 and 306 of phonon output obtained plotted as a function of frequency. Under the same conditions, the displacement of the resonator 202 (FIG. 2) is measured using an SEM. Three graphs 308, 310 and 312 of displacement amplitude plotted as a function of frequency are also shown in FIG. 3. The low drive conditions for graphs 302 and 308, 304 and 310 and 306 and 312 are $V_p=4.0$V and $v_d=200$ mV, $V_p=4.0$V and $V_d=150$ mV and $V_p=3.0$V and $v_d=200$ mV respectively. The low-drive condition results in peak to peak amplitudes of less than 2 μm which ensures linear resonator behavior.

Comparing the three graphs 302, 304 and 306 obtained using phonon sensing with those 308, 310 and 312 obtained under SEM technique, it can be observed that the phonon output is representative of the displacement amplitude and is also directly related to the displacement amplitude.

Further, resonance peaks of the resonator 202 (FIG. 2) are found at about 161.196, 161.213 and 161.233 kHz for the three low drive conditions respectively for both phonon sensing and SEM. There is a slight increase in resonance frequency of about 37 Hz as resonator drive strength is reduced. This could be caused by resonator hysteresis, reduced internal damping at lower drive levels as well as other non-linear mechanisms. The resonance peaks of the resonator 202 (FIG. 2) for both phonon sensing and SEM are well aligned. The phase shift between the phonon detection and displacement for the resonator 202 (FIG. 2) is about 0°. Phase shift is a fundamental steady-state alternating current (a.c.) system response and is dependent on specific device characteristics. Therefore, a person skilled in the art will appreciate that a non-zero phase shift may be obtained from other MEMS devices.

The quality factor, Q can be calculated from the amplitude response using the expression $$Q = \frac{f_r}{\Delta f_r} \tag{3}$$

where $f_r$ is the resonant frequency and $\Delta f_r$ is the −3 dB bandwidth. Average experimental Q values of 21644 and 19813 were obtained from SEM displacement and phonon measurements respectively. This is about 40 times higher than the Q of around 500 obtained under atmospheric pressure and is expected due to the absence of external air viscous damping. For the current resonator design, a peak to peak displacement of 233 nm was measured in a $6.0\times10^{-6}$ Torr vacuum at $V_p=4.0$V and $V_d=200$ mV. Considering the resonator's design values of $\partial C/\partial x=1.88$ nF/m and $k_{sys}=237$ N/m, a theoretical O-factor of 18358 was calculated using Equation (1). This value compares favorably with the experimental Q values obtained.

Experiments at higher drive conditions resulting in non-linear resonator behavior were also conducted. Drive conditions of $V_p=13{,}28$V and $v_d=1.00$V in high vacuum were used as the frequency of $v_d$ varied around resonance.

Figure 4:
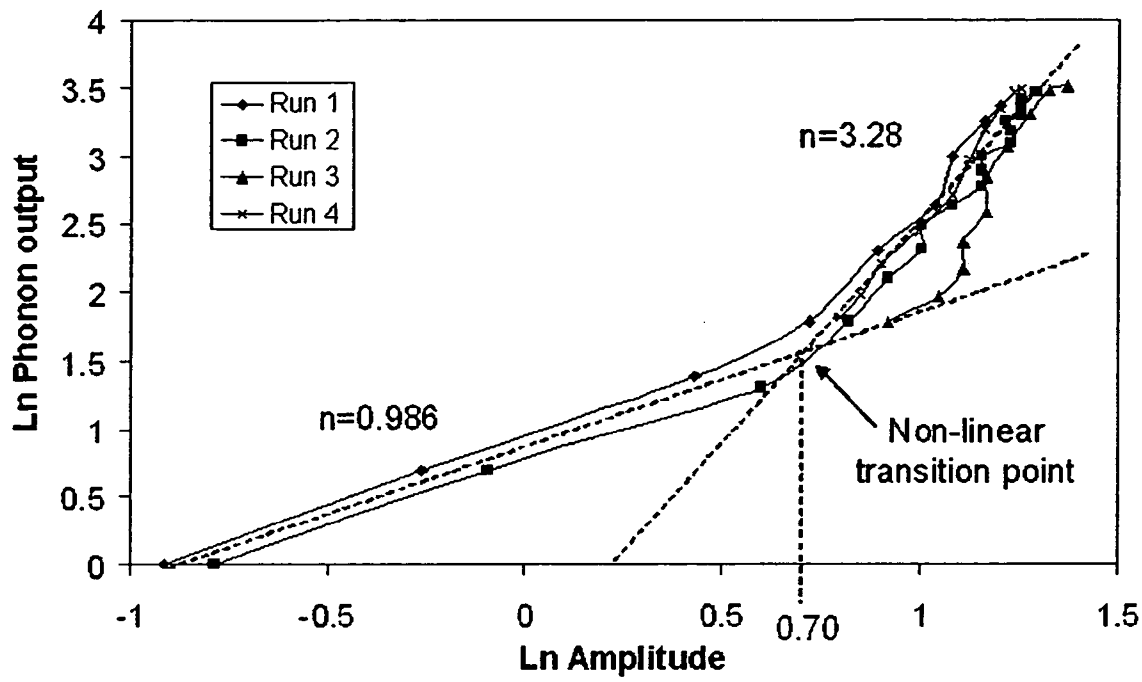
FIG. 4 shows a logarithmic plot of phonon voltage versus resonator amplitude for the resonator of FIG. 2 in vacuum.

It is assumed that the relationship between the phonon voltage V and resonator amplitude X has the generalized form $V=AX^n$, where A is a gain coefficient. Hence, the slope of a logarithmic plot of V versus X would yield the exponential factor n. FIG. 4 shows the logarithmic plot of V versus X. For small resonator peak to peak amplitudes below 2.0 μm, the value of the n is found via regression analysis to be 0.986, close to the value of 1.0 predicted by the one-dimensional phonon wave coupling model described in Equation (2) which assumes linear resonator behavior.

However, for larger peak to peak amplitudes exceeding 2.0 μm, a larger value of n=3.28 is obtained indicating deviation from linear behavior. A possible explanation is that for large resonator amplitudes, non-linear resonator operation occurs which is corroborated by in-situ observations of pronounced Duffing behavior in which the resonance response falls off very sharply (within a 0.1 Hz change) as the frequency of $v_d$ is increased beyond the resonant frequency. This value of n=3.28 is also consistent with the 3$^{rd}$ order Duffing equation for an oscillator in non-linear vibration. Additional internal phonon dissipation modes may be present in addition to phonons generated by the bulk mechanical motion of the resonator structure, resulting in an elevated level of phonon dissipation beyond the first order relationship assumed in Equation (2).

Experiments are also conducted using a light-microscope based probe station at atmospheric pressure (760 Torr). The resonators 202 (FIG. 2) are driven using $V_p=28.3$V and $v_d=2.40$V to comparable peak to peak amplitudes (below 1.0 μm) in the previous low-drive vacuum experiments to facilitate direct comparison of linear resonator behavior in air and vacuum. Concurrent frequency response measurements are made using both phonon detection and electrical capacitive measurements using an Agilent 8753ES S-parameter network analyzer, the latter being an existing reference technique for non-invasive resonator response characterization.

Figure 5:
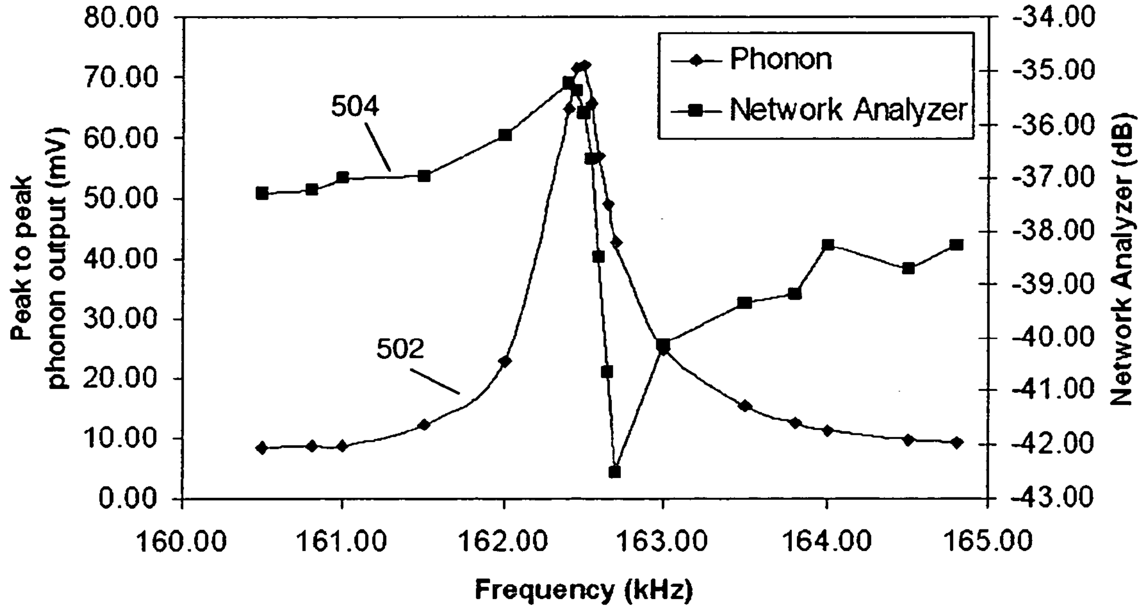
FIG. 5 shows a graph of peak to peak phonon output obtained from the resonator of FIG. 2 in air using phonon detection plotted as a function of frequency and a graph of signal strength obtained using network analyzer plotted as a function of frequency.

The resonator 202 (FIG. 2) is also characterized in air using phonon detection. FIG. 5 shows a graph 502 of peak to peak phonon output obtained plotted as a function of frequency. The resonator 202 (FIG. 2) is also characterized in air using electrical capacitive measurements analyzed on the network analyzer. A reference graph 504 of signal strength obtained with electrical capacitive measurements plotted as a function of frequency is also shown in FIG. 5. In these electrical capacitive measurements, the output from the network analyzer is representative of displacement.

Comparing the plots 502 and 504, it can be observed that the same resonance peak of about 162.50 kHz is achieved for both phonon detection and electrical capacitive measurements.

However, due to parasitic coupling capacitances between the drive and sense elements inherent in network analyzer measurements, an artifact in the form of an additional anti-resonance peak is present as shown in plot 504 of FIG. 5. This is a shortcoming of capacitive measurements as this complicates the accurate estimation of Δf, in the calculation of Q. Hence, an estimation of Q is more precisely made using alternative approaches.

Therefore, a more dependable experimental Q value of 465 is obtained using the phonon resonance profile which compares well with previously documented Q values of about 500 for this particular resonator 202 (FIG. 2). This significantly lower value of Q compared with about 20000 at high vacuum illustrates the pronounced effect of external viscous damping such as Couette flow in lowering resonator Q. For the drive conditions ($V_p$=28.3V and $v_d$=2.40V) used in this case and using Q=465, the theoretical resonant peak to peak displacement (corresponding to the 72.1 mV phonon resonance peak in FIG. 5) was calculated using Equation (1) to be 501 nm, which is within the 2.0 μm threshold for non-linear resonator operation, and is comparable to the 200 nm peak to peak amplitudes attained in the linear mode vacuum measurements.

Possible industrial applications of the system 100 as described above include but are not limited to inline measurement of pull-in voltage for MEMS microswitch metrology, inline evaluation of dynamic MEMS operating parameters such as analysis of resonators, cantilevers, accelerometers and other applications involving phonon/acoustic detection (thermal acoustic microscopies such as electron-acoustic, photon/laser-acoustic, ion-acoustic techniques, scanning acoustic microscopy, etc.). Details of some applications of the system 100 are described in the following.

Characterization of MEMS Resonators

The system 100 is used to serve as a feasibility testbed for passive acoustic detection where external excitation by an electron or photon probe is not required, and to demonstrate a viable high measurement throughput alternative to the conventional Laser Doppler Vibrometry (LDV) technique. In this application, acoustic detection relies on phonons generated during dynamic operation of MEMS device. Hence, this detection mode is applicable to dynamically-actuated MEMS devices such as MEMS resonators and not quasi-static MEMS devices such as pressure sensors. The MEMS resonator is driven using a sinusoidal signal with frequencies spanning either side of the theoretical design resonance frequency at 155.0 kHz of the resonator.

Figure 6:
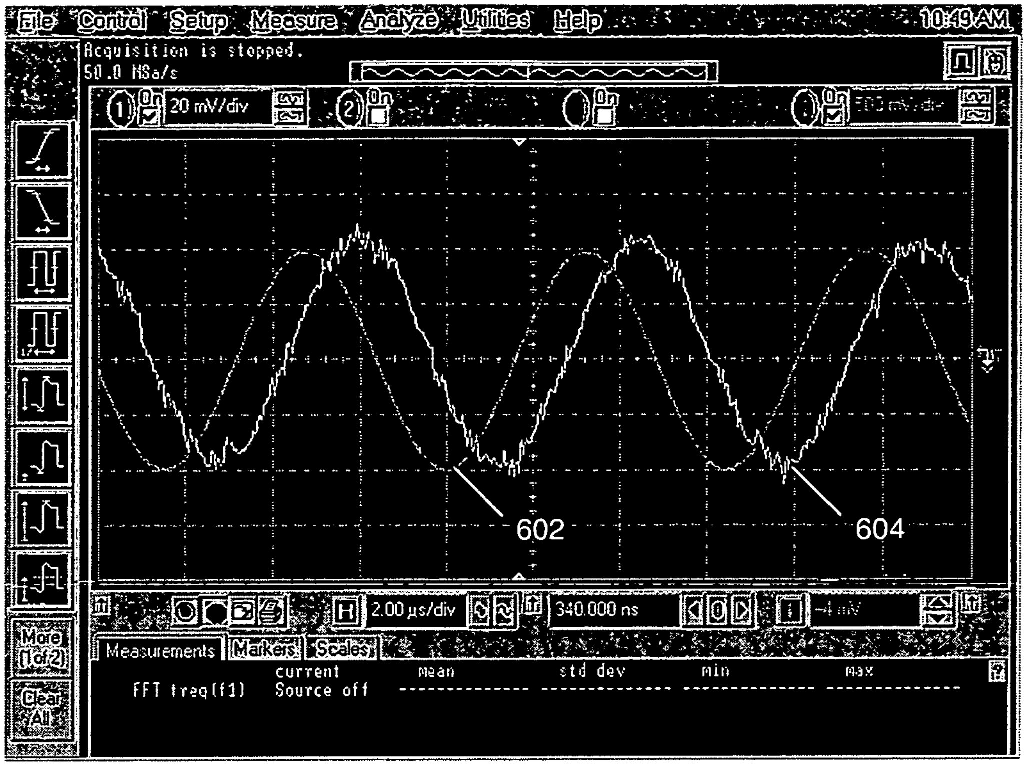
FIG. 6 shows a time-domain phase relationship between a driving signal and a phonon signal for the MEMS resonator of FIG. 2 at 155 kHz resonance.

FIG. 6 shows a time-domain phase relationship between a driving signal 602 and a phonon signal 604 for the MEMS resonator 202 (FIG. 2) at 155 kHz resonance. Information relating to the phase shift of the MEMS resonator 202 (FIG. 2) with respect to the driving signal 602 is provided. There is a phase shift of about 67.90 between the resonator oscillation 604 and the driving signal 602 at resonance. This phase shift information can be used to obtain further insights into the efficiency of the resonator design and also as an optimization tool for both the resonator 202 (FIG. 2) and interface circuit design.

Figure 7:
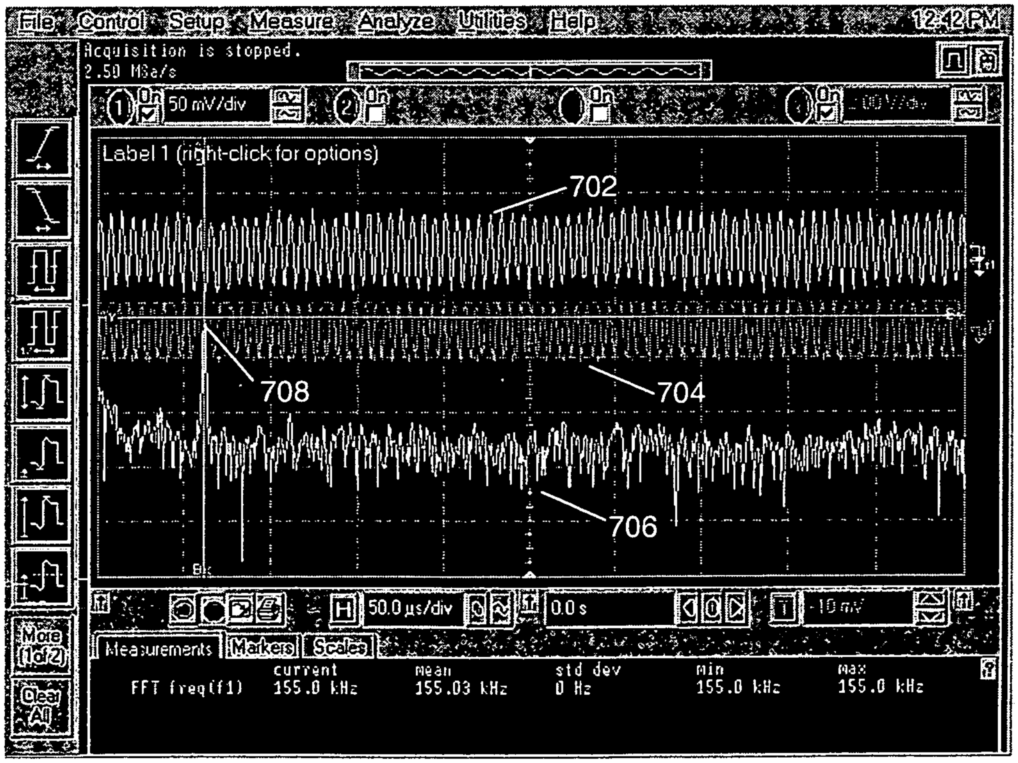
FIG. 7 shows a Fast Fourier Transform (FFT) frequency-domain phonon response for the MEMS resonator of FIG. 2 with respect to a time-domain phonon response and reference driving signal.

FIG. 7 shows a Fast Fourier Transform (FFT) frequency-domain phonon response for the MEMS resonator 202 (FIG. 2) with respect to a time-domain phonon response and reference driving signal. Graph 702 shows the time-domain phonon response. Graph 704 shows the time-domain reference driving signal. Graph 706 shows the Fast Fourier Transform (FFT) frequency-domain phonon response. The resonance peak 708 is found to be 155.03 kHz, which falls within the theoretical design range of 155.0+/−1 kHz. This result is consistent with the results obtained using network analyzer parametric measurements.

Phonon detection for MEMS resonator characterization also demonstrates excellent sensitivity as compared to conventional network analysis measurements. A resonator direct d.c. bias Output FFT Spectra Input of at least 20 volts is required for reasonable signal-to-noise (S/N) detection levels using conventional network analysis as compared to the design bias of 50V.

Figure 8:
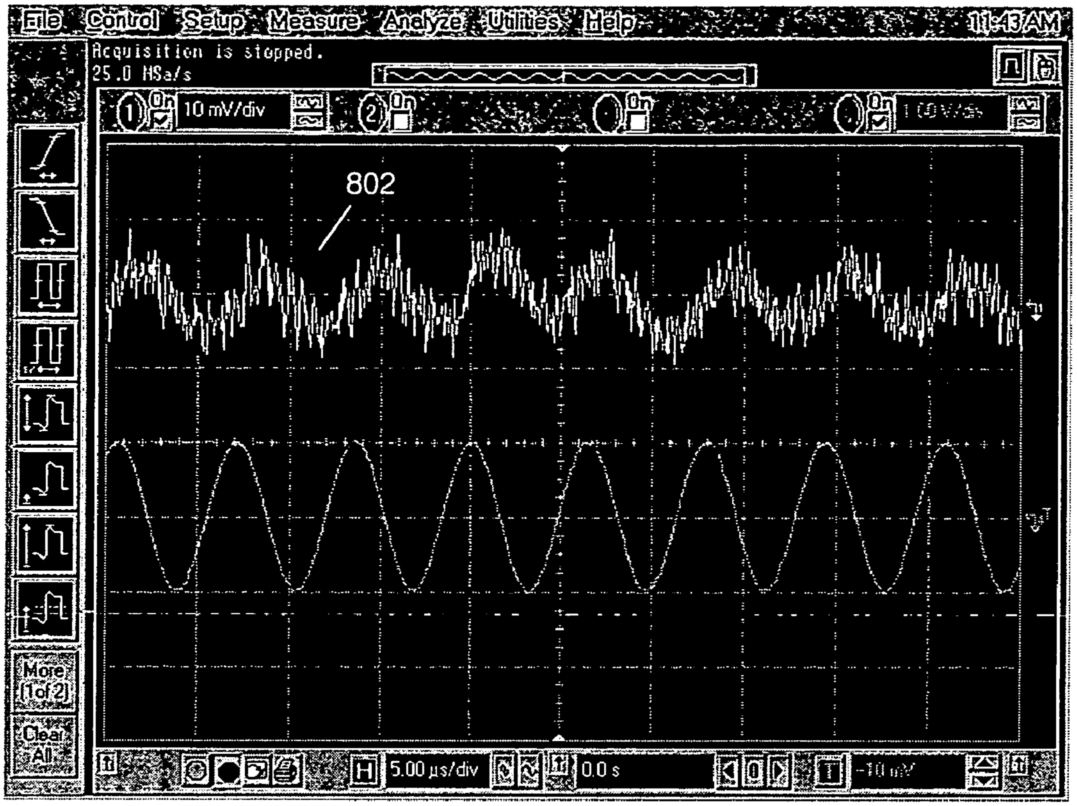
FIG. 8 shows sensitivity of phonon detection for the same MEMS resonator as for FIG. 6 at a resonator direct current (d.c.) bias voltage of 2.5V.

FIG. 8 shows sensitivity of phonon detection for the same MEMS resonator as for FIG. 6 at a resonator d.c. bias voltage of 2.5V. Graph 802 shows that S/N levels are comparably lower using phonon detection but requiring a resonator d.c. bias of only 2.5V. Further S/N improvement can be obtained if signal averaging is employed. This level of detection sensitivity cannot be attained using network analyzers. The sensitivity of this phonon characterization method allows characterization of device performances at a much greater range of bias voltages and also facilitates the scaling-down of MEMS resonator dimensions while maintaining device characterization ability, which is significant for the development of potential Nano Electro Mechanical Systems (NEMS) devices in the future.

Detection of MEMS Microswitch Contact Event

The system 100 is applied for detection and characterization of a MEMS microswitch operation. There is a distinct contact event as the MEMS switch operates. Of great interest to the industry is the characterization of this switching event as a function of the switch driving voltage (called the pull-in voltage for electrostatically-actuated switches) so that optimal pull-in voltages could be customized for individual MEMS switches. The optimal voltage is critical for the proper, lowest contact impedance switching performance while at the same time ensuring maximum device reliability and operating life.

Figure 9:
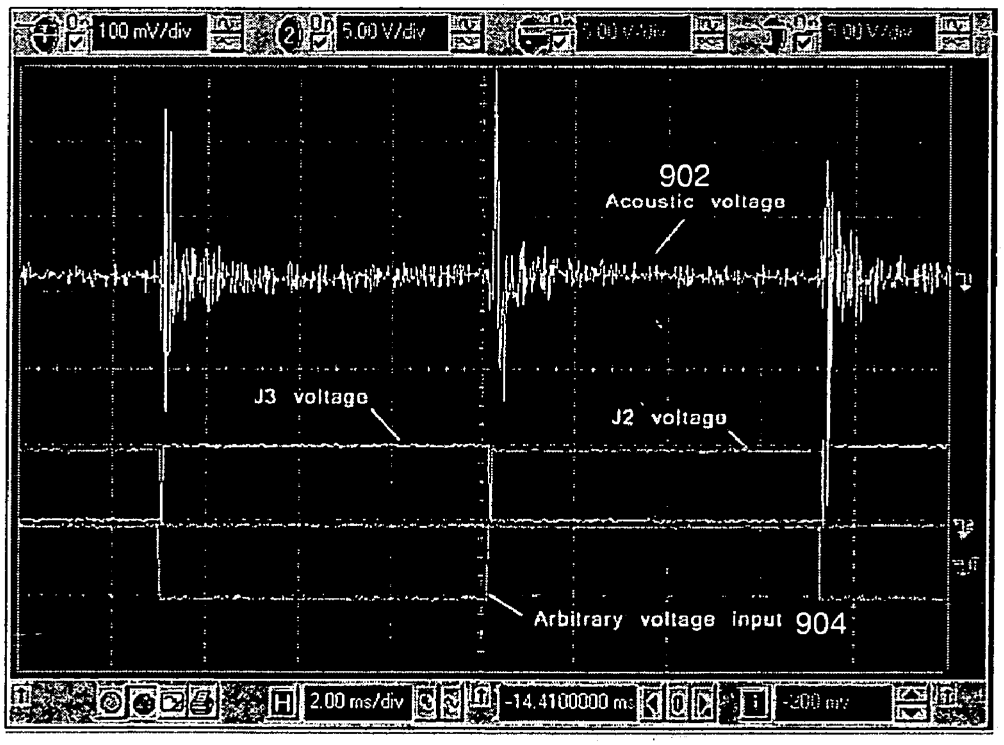
FIG. 9 shows time-domain results of an RF MEMS switch.

FIG. 9 shows time-domain results of the RF MEMS switch. An output 902 from the detection technique, which clearly shows the phonon output from the contact impulse input 904, is observed. Besides having excellent detection sensitivity, the phonon impulse response also carries useful information on the MEMS structures such as the damping factor, resonance modes and acoustic-mechanical-electrical properties. For example, frequency analysis of the time-domain phonon signals reveals resonance frequencies at around 20 kHz and 146 kHz which was traced to the primary resonance mode of the MEMS microswitch and phonon detection housing respectively.

Analysis of Switch Transit Dynamics

Figure 10:
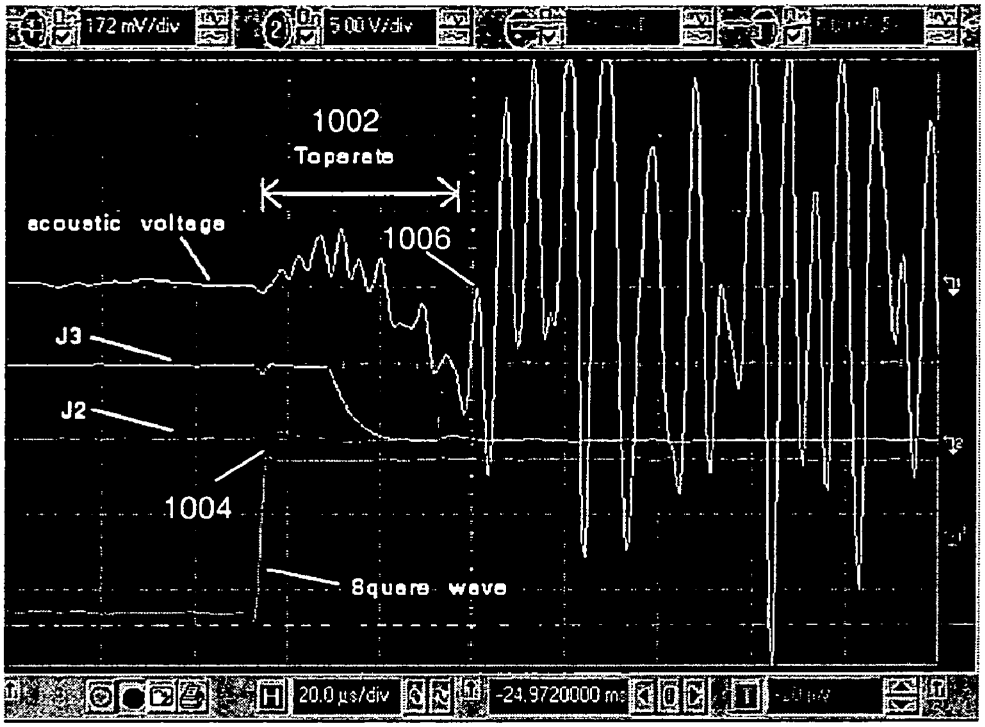
FIG. 10 shows switching transients of the same RF MEMS switch as for FIG. 9.

The system 100 is used to demonstrate the excellent sensitivity of the technique in the time-domain by its ability to reveal the switching transit time and dynamics reliably and accurately. FIG. 10 shows switching transients of the same RF MEMS switch as for FIG. 9. A lag time ($T_{operate}$) 1002 between reference signal driving 1004 and the actual switch closing contact event 1006 is measured to be about 44.0 μs. Furthermore, the detection method is also able to reveal certain details about the MEMS microswitch while in transit as shown by the minor oscillatory modes detecting even as the switch was moving towards its closed or contact state.

Figure 11:
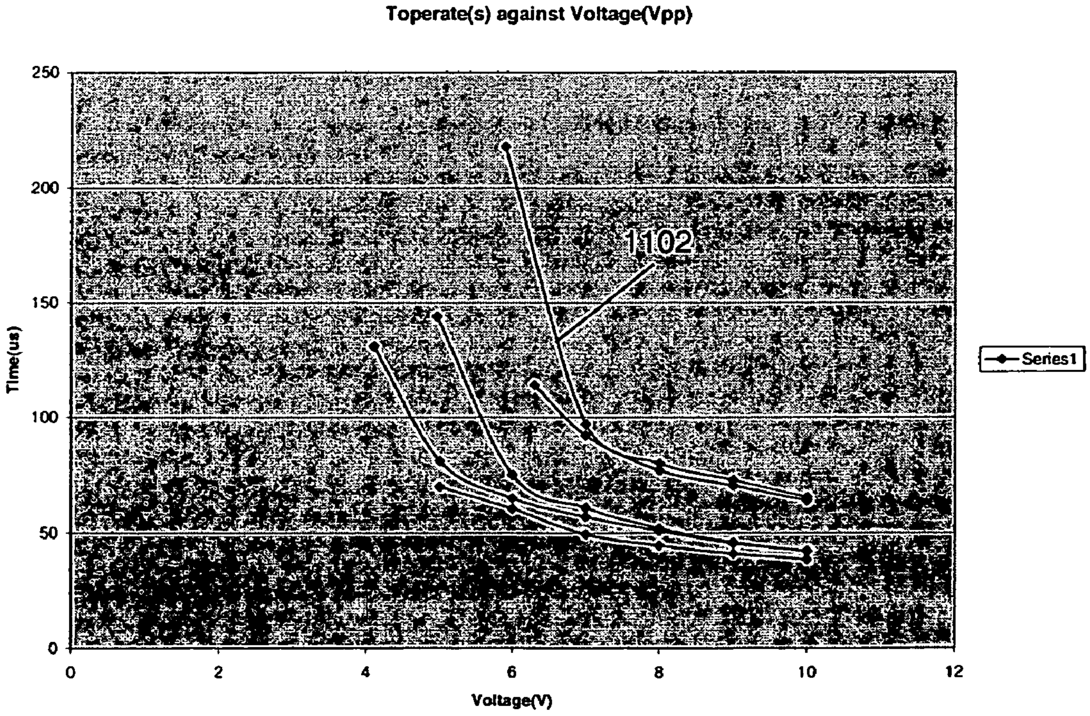
FIG. 11 shows results of a switching lag time $T_{operate}$ as a function of a pull-in voltage used for a batch of 6 RF MEMS switches of the same design.

The system 100 can be utilised to determine the optimal pull-in voltage of the RF MEMS switch. FIG. 11 shows results of the switching lag time $T_{operate}$ as a function of the pull-in voltage used for a batch of 6 RF MEMS switches of the same design. Differences in the transient switching characteristics of the switches at various voltages are observed. For example, switching delays ranging from as slow as 220 μs at lower pull-in voltages to the fastest at about 40 μs are recorded. This characterization capability will no doubt be of great interest to RF MEMS switch designers.

It is also found that the slowest switch indicated by the curve 1102 in FIG. 11 subsequently suffered premature failure (after only a few thousand switching cycles compared to the rated life of a million cycles). This is indicative of the potential of the technique as a predictor of impending premature device failure.

Figure 12:
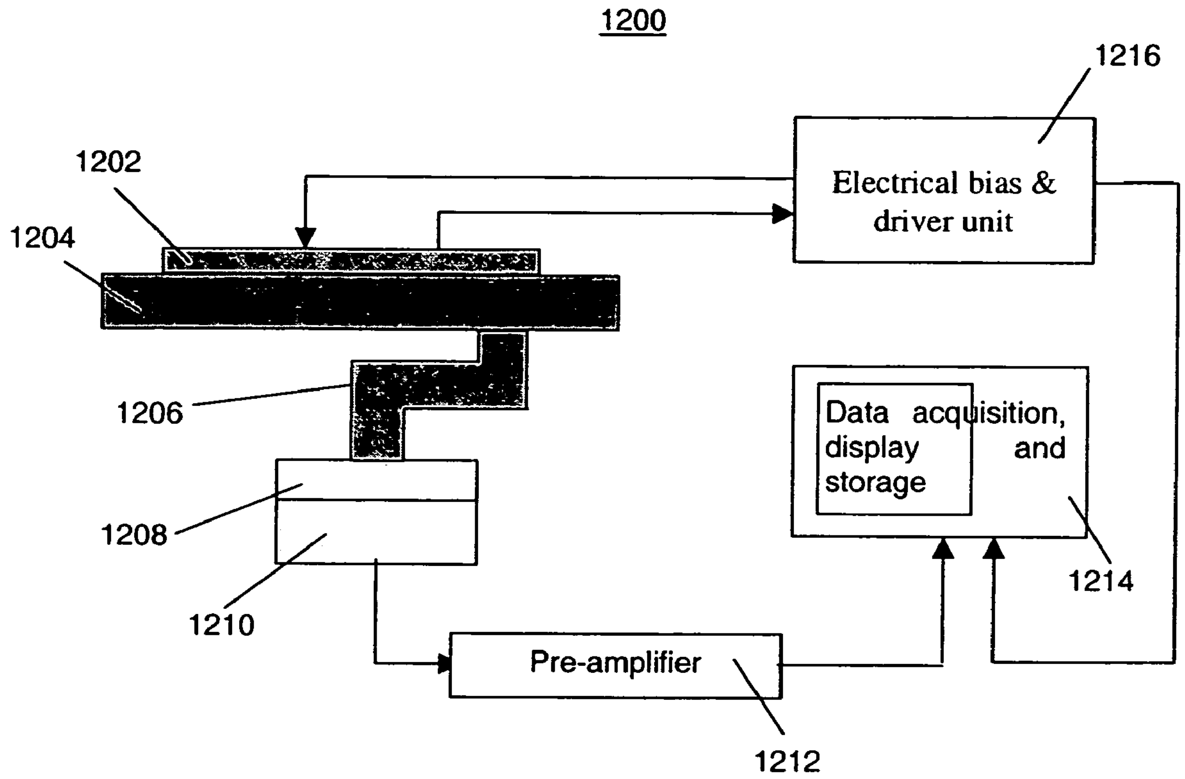
FIG. 12 shows a schematic diagram of a phonon-based characterization system for wafer testing.

FIG. 12 shows a schematic diagram of a phonon-based characterization system 1200 for inline wafer testing. A semiconductor wafer 1202 including dies of MEMS structures for MEMS devices is received on a wafer chuck 1204. The system 1200 utilises detection of phonons generated during dynamic MEMS operation to remotely characterize the MEMS structures operation.

An acoustic coupler structure 1206 is disposed between the wafer chunk 1204 and a phonon detector and converter in the form of a piezoelectric transducer 1208. The coupler structure 1206 removes the need for an immediate, coplanar mount between the piezoelectric transducer 1208 and the wafer 1202. The coupler structure 1206 is made of materials that are acoustically matched to the wafer chuck 1204 and the piezoelectric transducer 1208, i.e. having similar acoustic impedance Z. It will be appreciated by a person skilled in the art that if the other end of the coupler structure 1206 is in direct contact with the wafer 1202, the coupler structure 1206 is made of materials that are acoustically matched to both the wafer 1202 and the piezoelectric transducer 1208. According to the general expression for acoustic reflection coefficient AR, acoustic matching is accomplished when $Z_1=Z_2$, i.e. $A_R=0$.

$$A_R = \left(\frac{Z_2 - Z_1}{Z_2 + Z_1}\right) \tag{4}$$

Figure 13:
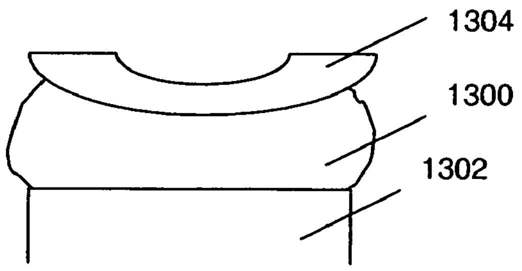
FIG. 13 shows a schematic drawing of a pliable material sandwiched between an end portion of an acoustic coupler and a curved structure.

It will be appreciated by a person skilled in the art that the coupler structure 1206 can be employed for other applications such as packaged devices. The coupler structure 1206 also enables non-planar samples, e.g. curved surfaces to be probed using pliable materials such as acoustically conductive silicon gels and pastes FIG. 13 shows a schematic drawing of a pliable material 1300 sandwiched between an end portion 1302 of a coupler structure and a curved structure 1304. The pliable material 1300 can be used to provide a larger effective acoustic contact area, thus providing a better acoustic coupling. The improvement in acoustic coupling is found to be about 25-33%. However, useful results can still be produced by using the coupler structure 1206 without the pliable materials on non-planar samples. coupler structure-coupler structurecoupler structurecoupler structure The piezoelectric transducer 1208 is placed in contact with the coupler structure 1206 to facilitate acoustic coupling between the coupler structure 1206 and the piezoelectric transducer 1208. The piezoelectric transducer 1208 is made of materials including but not limited to titanate compounds such Lead Zirconate Titanate (PZT), Barium Titanate ($BaTiO_3$) and PolyVinyl Dene Fluoride (PVDF). Other devices may be used as an acoustic to electrical converter in the system 1200.

The piezoelectric transducer 1206 converts phonon energy into an electrical signal. An electrically-conducting metal spacer 1210 is used as an electrical feed through for the piezoelectric transducer 1208. The metal spacer 1210 also improves the efficiency of the piezoelectric transducer 1208 by confining the phonon energy within the piezoelectric transducer 1208 using acoustic reflection.

The output signals of the piezoelectric transducer 1208 have typical amplitude in the order of microvolts. Hence, preferably adequate screening and proper grounding of the system are provided for improving signal quality. Further improvement can be obtained by the use of appropriate pre-amplification to reduce the relative effects of noise before subsequent signal display and processing. In the system 1200, the output signals of the piezoelectric transducer 1208 are amplified by a preamplifier 1212.

The output signals are subsequently processed for signal acquisition, display and storage. A computer 1214 is used for digital acquisition, processing and storage. Examples of display and processing include but not limited to time and frequency domain processing of the signal using oscilloscopes and spectrum analysers and, lock-in and box-car averaging for low signal situations.

A stimulator in the form of an electrical bias and driver unit 1216 coupled to driver and bias contacts (not shown) respectively of the MEMS structures on the wafer 1202 for device actuation is employed in the system 1200 for MEMS structures such as MEMS microswitches.

For passive MEMS structures, the arrangement is modified for external stimulus being provided by applying a known acceleration into the device. In such an arrangement, the stimulation involves transferring a mechanical displacement or acceleration from an electrodynamic shaker through multiple electromechanical interfaces into the MEMS devices under test, such as MEMS accelerometers.

The system as described above can be easy to implement even within the constraints of an inline manufacturing environment because only a single, static mount between the phonon detector and sample may be needed. This is due to the bulk-propagation properties of phonons in solids, which allow the phonons generated from any location within a sample to be detected from any singular location as long as an acoustic transmission path between the generation and detection site exists.

Since phonons are detectable on any external location on packaged devices, destructive depackaging for die probing are unnecessary, therefore allowing non-invasive testing and high measurement throughput to be attained. This can ensure that testing and characterization configuration most accurately reflects field-use situations for the most realistic characterization results.

These attributes make phonon detection particularly suitable for package level mass-volume dynamic MEMS product testing where device integrity and testing throughput is paramount. Phonon detection is also intrinsically extensible to wafer-level characterization, thus making it suitable for inline application in a manufacturing environment.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, it will be appreciated that the present invention is not limited to the specific MEMS structures/devices described herein.

The invention claimed is:

1. A system for Micro Electro Mechanical System (MEMS) device characterization; the system comprising:

a stimulator for stimulating the device to generate phonons in the device;

a detector for detecting the generated phonons;

a converter for converting the phonons into a signal representative of displacement of a MEMS component of the device.

2. The system as claimed in claim 1, wherein the signal comprises an electrical signal.

3. The system as claimed in claim 2, wherein the detector and the converter are implemented as a piezoelectric transducer for detecting and converting the phonons into the electrical signal.

4. The system as claimed in claim 3, further comprising an acoustic coupler disposed between the device and the piezoelectric transducer.

5. The system as claimed in claim 2, further comprising an amplifier for amplifying the electrical signal.

6. The system as claimed in claim 1, wherein the stimulator comprises a driving signal source for activating the MEMS component.

7. The system as claimed in claim 1, wherein the stimulator applies an external force to the MEMS device for activating the MEMS component.

8. A method for Micro Electro Mechanical System (MEMS) device characterization;

the method comprising the steps of:

stimulating the device to generate phonons in the device;

detecting the generated phonons;

converting the phonons into a signal representative of displacement of a MEMS component of the device.

9. The method as claimed in claim 8, wherein the signal comprises an electrical signal.

10. The method as claimed in claim 9, wherein the phonons are detected and converted into the electrical signal utilising a piezoelectric transducer.

11. The method as claimed in claim 10, further comprising utilising an acoustic coupler disposed between the device and the piezoelectric transducer.

12. The method as claimed in claim 11, further comprising utilising pliable materials with the acoustic coupler for non-planar samples.

13. The method as claimed in claim 9, further comprising amplifying the electrical signal.

14. The method as claimed in claim 8, wherein the stimulating comprises activating the MEMS component utilising a driving signal for the MEMS device.

15. The method as claimed in claim 8, wherein the stimulating comprises activating the MEMS component by applying an external force to the MEMS device.

16. The system as claimed in claim 3, further comprising an amplifier for amplifying the electrical signal.

17. The method as claimed in claim 10, further comprising amplifying the electrical signal.

* * * * *